United States Patent
Stark

(10) Patent No.: US 10,283,664 B2
(45) Date of Patent: May 7, 2019

(54) AVALANCHE DIODE INCLUDING VERTICAL PN JUNCTION

(71) Applicant: STMICROELECTRONICS (RESEARCH & DEVELOPMENT) LIMITED, Marlow (GB)

(72) Inventor: Laurence Stark, Edinburgh (GB)

(73) Assignee: STMICROELECTRONICS (RESEARCH & DEVELOPMENT) LIMITED, Marlow (GB)

( * ) Notice: Subject to any disclaimer, the term of this patent is extended or adjusted under 35 U.S.C. 154(b) by 21 days.

(21) Appl. No.: 15/609,854

(22) Filed: May 31, 2017

(65) Prior Publication Data

US 2018/0108799 A1   Apr. 19, 2018

(30) Foreign Application Priority Data

Oct. 14, 2016  (EP) .................................. 16194040

(51) Int. Cl.
| | |
|---|---|
| H01L 31/107 | (2006.01) |
| H01L 31/02 | (2006.01) |
| H01L 31/0352 | (2006.01) |
| G01J 1/44 | (2006.01) |
| H01L 31/103 | (2006.01) |
| H01L 31/18 | (2006.01) |
| H01L 29/72 | (2006.01) |

(52) U.S. Cl.
CPC ............ *H01L 31/107* (2013.01); *H01L 29/72* (2013.01); *H01L 31/02027* (2013.01); *H01L 31/0352* (2013.01); *H01L 31/1037* (2013.01); *H01L 31/1804* (2013.01); *G01J 2001/4466* (2013.01); *Y02E 10/547* (2013.01); *Y02P 70/521* (2015.11)

(58) Field of Classification Search
CPC . H01L 31/107; H01L 29/72; H01L 31/02027; H01L 31/0352; H01L 31/18; H01L 27/146; H01L 31/1037; H01L 31/1804; G01J 2001/4466; Y02P 70/521; Y02E 10/547
USPC ............................ 257/603; 438/91, 380, 983
See application file for complete search history.

(56) References Cited

U.S. PATENT DOCUMENTS

| | | | | |
|---|---|---|---|---|
| 4,628,273 | A  * | 12/1986 | Vlasak | .................. H01L 31/145 257/E31.1 |
| 6,177,289 | B1 * | 1/2001 | Crow | .............. H01L 31/035281 257/E31.038 |
| 6,707,075 | B1 | 3/2004 | Rogers et al. | |
| 2006/0091489 | A1 * | 5/2006 | Cheng | ................ H01L 31/03529 257/458 |
| 2007/0222015 | A1 | 9/2007 | Cheng et al. | |
| 2009/0250696 | A1 * | 10/2009 | Silver | ................. H01L 29/0615 257/46 |
| 2012/0267746 | A1 * | 10/2012 | Sanfilippo | ........... H01L 27/1446 257/438 |

(Continued)

FOREIGN PATENT DOCUMENTS

EP   2592661 A1   5/2013

*Primary Examiner* — Didarul A Mazumder
(74) *Attorney, Agent, or Firm* — Slater Matsil, LLP

(57) ABSTRACT

An avalanche diode includes a PN junction with a first deep trench structure adjacent to the PN junction. An area via which photons impinge is provided, the PN junction extending substantially vertically with respect to the area. An avalanche diode array can be formed to include a number of avalanche diodes.

19 Claims, 14 Drawing Sheets

(56) References Cited

U.S. PATENT DOCUMENTS

2014/0312449 A1* 10/2014 Jonak-Auer ...... H01L 31/03529
257/438
2015/0076572 A1* 3/2015 Sakurano .......... H01L 27/14609
257/291

* cited by examiner

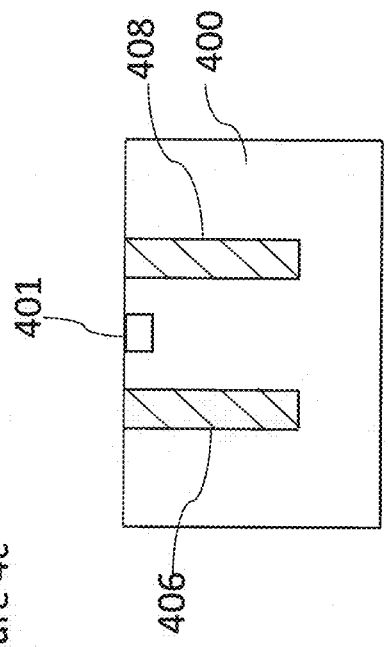
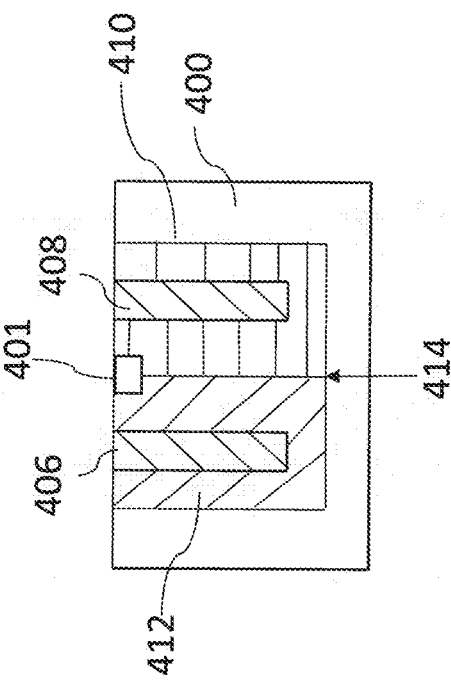
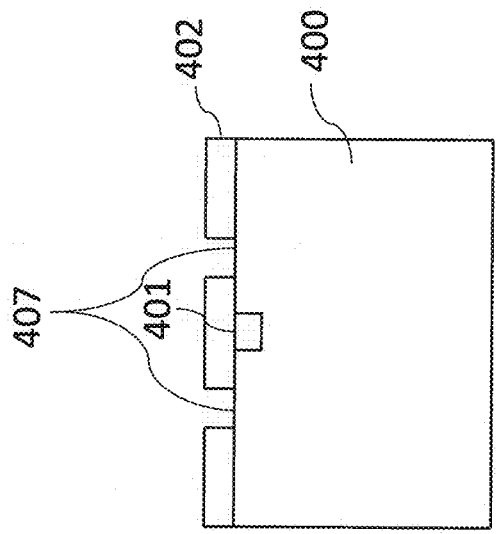
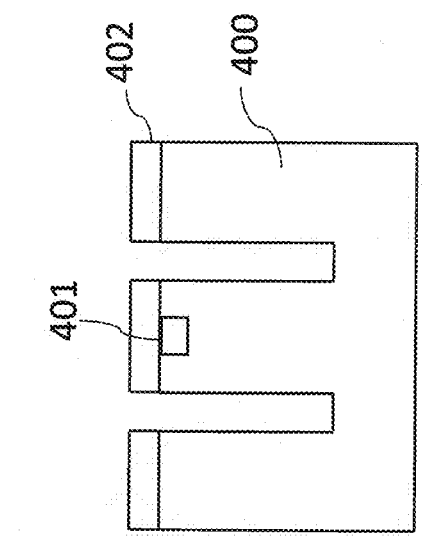

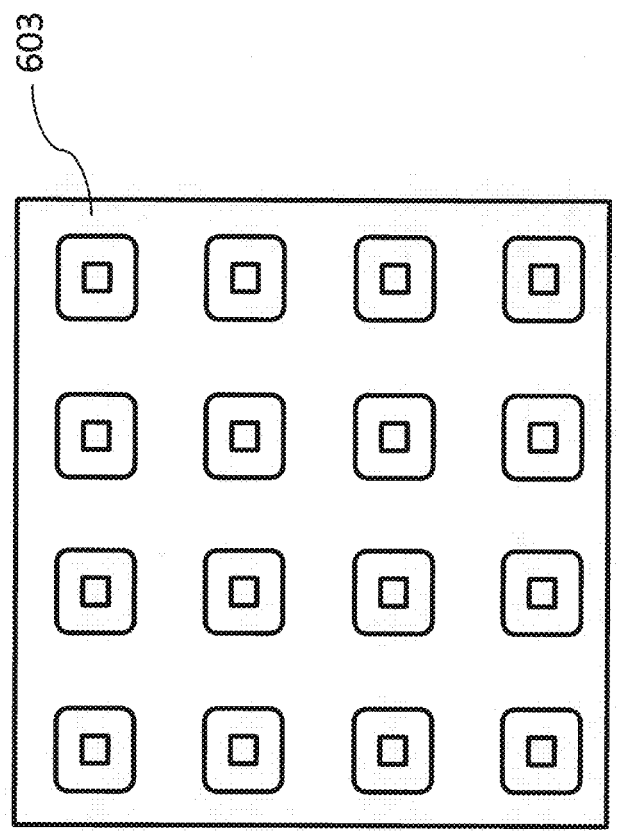

AVALANCHE DIODE INCLUDING VERTICAL PN JUNCTION

CROSS-REFERENCE TO RELATED APPLICATIONS

This application claims priority to European Patent Application No. 16194040.8, filed on Oct. 14, 2016, which application is hereby incorporated herein by reference.

TECHNICAL FIELD

This disclosure relates to an avalanche diode and method for manufacturing the same.

BACKGROUND

A single photon avalanche detector (SPAD) is based on a PN junction device biased beyond its breakdown region. A high reverse bias voltage generates a sufficiently large electric field such that a single charge carrier introduced into a depletion layer of the PN junction device can cause a self-sustaining avalanche. This charge carrier may be released by the impact of a photon (impact ionization). The SPAD may be quenched, allowing the device to be reset to detect further photons.

SUMMARY

According to an aspect there is provided an avalanche diode comprising a PN junction, a first deep trench structure on adjacent to the PN junction and an area via which photons impinge, the PN junction extending substantially vertically with respect to the area.

The avalanche diode may comprise a second deep trench structure on an opposite side of the PN junction to the first deep trench structure.

The deep trench structure may comprise one of a conductive material and an insulating material.

The conductive material may comprise polysilicon or tungsten.

The insulating material may comprise silicon oxide.

Some embodiments may provide an array of avalanche diodes, wherein each avalanche diode is as discussed previous.

The array of avalanche diodes may comprise a common anode to which the avalanche diodes are coupled and an OR gate to which an output of each avalanche diode of the array is coupled.

In the array, one of the trench structures of at least one of the avalanche diodes in the array may be shared with one or more other avalanche diodes of the array.

According to another aspect, there is provided a method of manufacturing an avalanche diode comprising providing a first trench in a substrate material, filling the first trench with a material comprising one of a P dopant and an N dopant, and causing the one dopant to diffuse from the first trench and to thereby provide one part of a PM junction.

The method may comprise providing a second trench in the substrate material, filling the second trench with a material comprising the other of the P dopant and N dopant, and causing the other dopant to diffuse from the second trench to provide another part of the PN junction.

The method may comprise the substrate comprising the other of the P dopant and N dopant.

The method may comprise, after causing diffusion of the one of a P dopant and N dopant, removing the material from the first trench, filling the first trench with a material having the other of the P dopant and N dopant, and causing the other dopant to diffuse from the first trench to provide another part of the PN junction.

The method may comprise causing diffusion of the one of the P dopant and N dopant by annealing of the substrate.

The method may comprise the material being one of a conductive material and an insulating material.

The method may comprise the formation of an array of avalanche diodes.

The method may comprise the formation of an array of avalanche diodes in which each of the avalanche diodes share a common anode to which the avalanche diodes are coupled and an OR gate to which an output of each of the avalanche diodes of the array is coupled.

BRIEF DESCRIPTION OF THE DRAWINGS

Reference will now be made, by way of example only, to the accompanying drawings in which:

FIGS. 4a to 4e schematically shows the steps in the manufacture of the SPAD of FIG. 3;

FIG. 6b shows an array of SPADs without guard rings;

DETAILED DESCRIPTION OF ILLUSTRATIVE EMBODIMENTS

Single-photon avalanche diodes, or "SPADs", are also called Geiger mode avalanche photo diodes GAPD. These devices have a reverse biased PN junction in which a photo-generated carrier can trigger an avalanche current due to an impact ionization mechanism. SPADs may be designed to operate with a reverse bias voltage well above the breakdown voltage.

Figure 1:
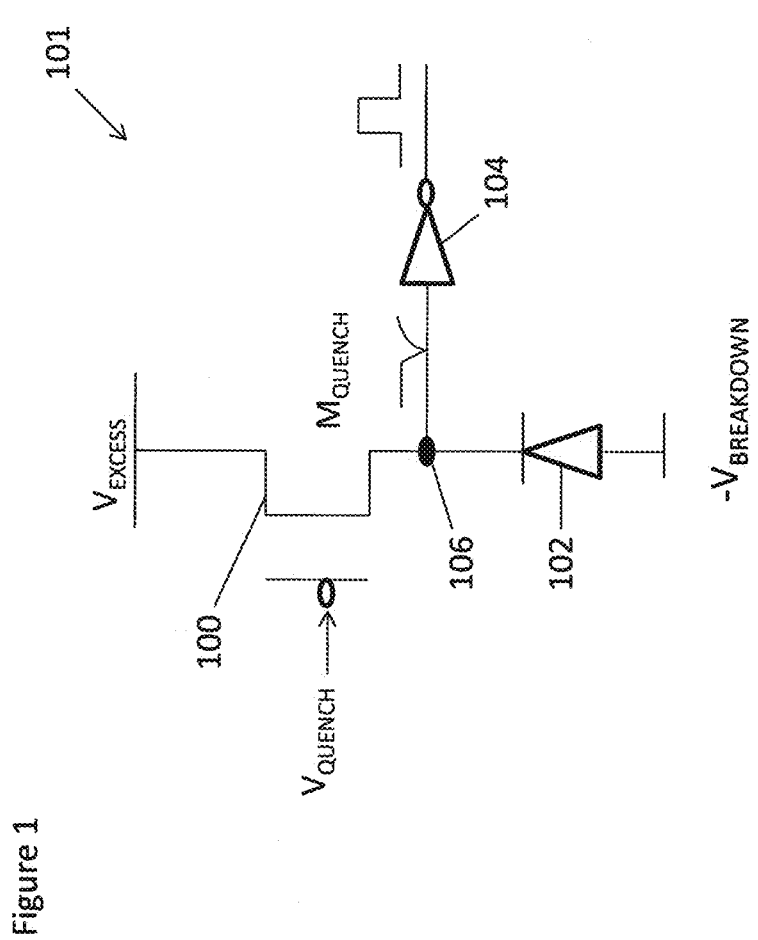
FIG. 1 is a diagram of a SPAD with a quench and readout circuit.

FIG. 1 schematically shows a single photon avalanche diode (SPAD) 101. The SPAD 101 has a reverse biased PN junction 102. The reverse biased PN junction 102 has a high reverse bias voltage (−VBREAKDOWN). With this reverse bias voltage, a relatively high electric field is generated such that a single charge carrier injected into the depletion layer triggers a self-sustaining avalanche via impact ionization. In other words, a photon impacting on the reverse biased PN junction device 102 releases a single charge which triggers a chain reaction releasing a large number of electrons leading to a large current.

To reset the device 102, the current flow is quenched. Without quenching, the PN junction device 102 may be permanently damaged.

Different types of quenching are known. For example, passive or active quenching may be used. Passive quenching may, for example, use a resistor in series with the SPAD. The avalanche current is effectively quenched as a voltage drop is developed across a relatively high value resistance of the resistor. Alternatively, active quenching may be used.

FIG. 1 shows an example where passive quenching is used. A P-type MOSFET (metal-oxide-semiconductor field-effect transistor) boo is provided in series with the PN junction device 102 and is connected between the more positive voltage, $V_{EXCESS}$ and the reverse biased PN junction device 102. A quenching voltage $V_{QUENCH}$ is applied to the gate of the MOSFET 100. Effectively the MOSFET 100 acts as a relatively high resistance resistor.

The voltage waveform at the node 106 between the MOSFET 100 and the PN junction device 102 can be seen schematically in FIG. 1. Initially, the output of the node 106 is at a relatively high voltage. When the photon impacts on the PN device 102, this causes a relatively large current to flow rapidly which causes the voltage on node 106 to drop rapidly. As the quenching voltage is applied, the voltage at node 106 rises back up to the initial voltage value. The voltage waveform at node 106 is passed through an inverter 104 to give a square waveform with the low levels of the wave representing the state prior to the impact of the photon on the P-N device and after quenching, and the high level representing the impact of a photon. The output of the inverter 104 can be provided to detection circuitry to be processed. For example, the output of the inverter 104 can be input to a counter which counts every time the output of the inverter goes high.

It should be appreciated that the SPAD shown in FIG. 1 and the quenching arrangement is by way of example only and other structures may alternatively be used. For example, active quenching may be used. Other passive quenching arrangements may be used in embodiments.

In some embodiments, an array of SPADs is used. However it should be appreciated that some embodiments may be used with a single SPAD.

A breakdown voltage is required to place the avalanche diode in the Geiger region of operation and cause the PN device to operate as a SPAD. The breakdown voltage is controlled by the voltage differential across the PN device rather than the absolute voltage values on either side of the reverse biased PN junction device.

Figure 2:
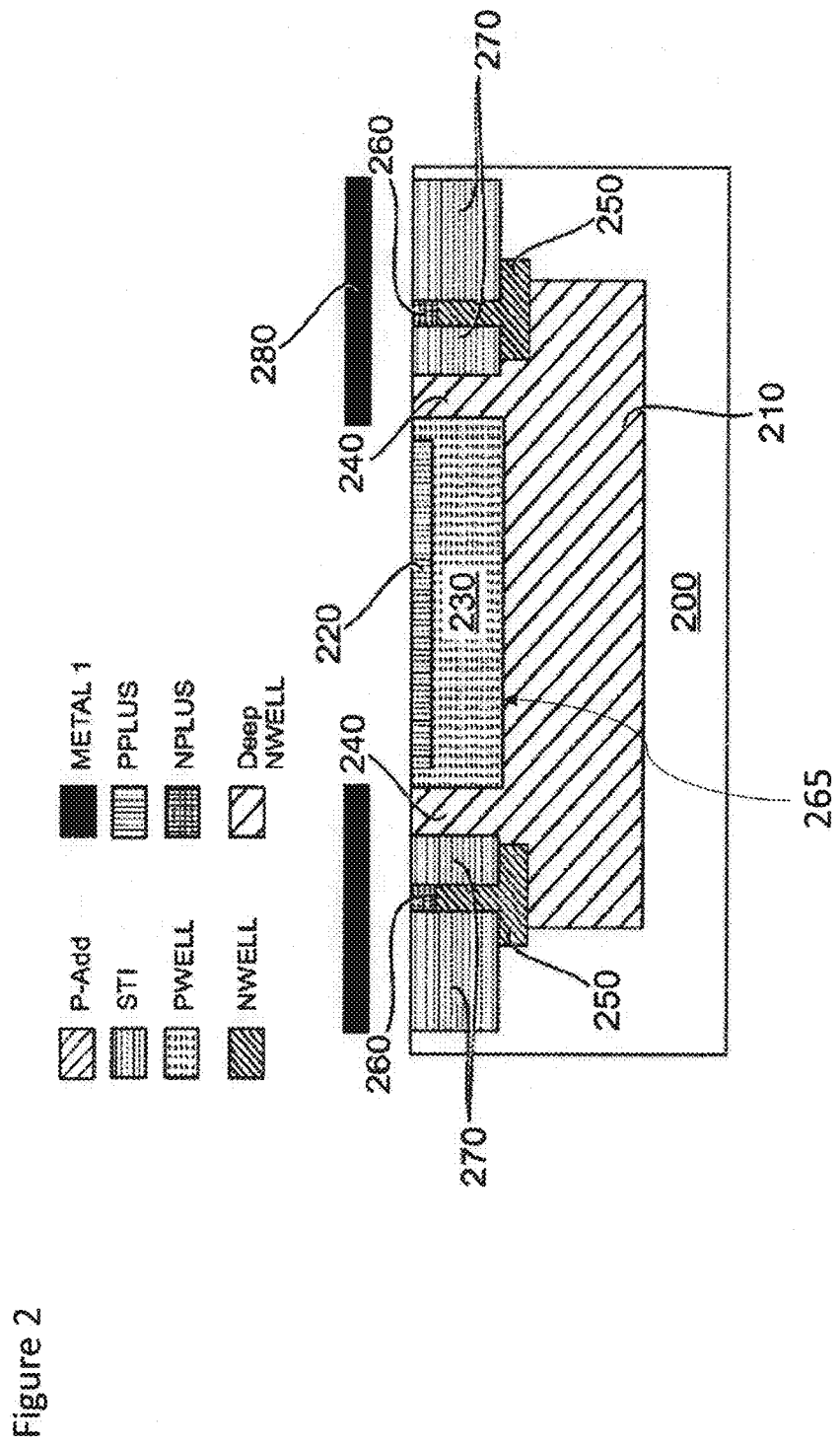
FIG. 2 is a schematic cross section of a known SPAD.

FIG. 2 shows a cross-section of a known single photon avalanche diode (SPAD) as provided in silicon. The base for all the implants is a lightly doped P-epi(taxial) 200 layer, which is deposited on a substrate (not shown). The deepest layer, or implant, is a deep (or buried) N-well layer 210, which forms the cathode of the device. The anode is comprised of a layer of P+ 220 material in a P-well 230, while a guard ring 240 is formed by the lightly doped P-epi layer. To provide good ohmic contact to the cathode there is provided regions of N-well 250 and N+ 260. Regions of STI (shallow trench isolation) 270 are provided to isolate this device from others on the same wafer. Also shown is a first metal layer 280.

The PN junction in this example is formed by the P-well and deep N-well layer.

Whilst SPADS of the general structure shown in FIG. 2 are suitable for a number of applications, this type of structure is not so efficient with longer wavelengths, for example at infrared or near infrared wavelengths. This is because with longer wavelengths, the electrons generated in response to impinging photons will generally be generated in the silicon well below the PN junction. This is because longer wavelengths have a greater penetration depth. Those electrons may recombine or are collected by the deep N-well. Accordingly, these electrons will not generally be detected by the SPAD.

The arrangement of FIG. 2 has a guard ring. The guard ring is used to prevent edge breakdown. This is to avoid the avalanche effect on the edge of the PN junction which is generally perpendicular to the surface of the SPAD. However, the guard ring is relatively large, increasing the size of the array. The guard ring can be for example of the order of 3 μm.

A relatively large gap is required between the edge of the guard ring and the adjacent SPAD. That gap may be of the order of 5 μm. This means that each SPAD and associated circuitry is relatively large. A SPAD with its associated circuitry is some time referred to as a pixel.

The SPAD shown in FIG. 2 may have a relatively poor QE (quantum efficiency) at longer wavelengths because the collection volume is relatively small (the collection volume for the SPAD in FIG. 2 is the avalanche region and the PWELL 'collection region' above it). The jitter is low because of the same reason. The PN junction may be relative large, meaning that there may be a relatively high power consumption. With a relatively large SPAD, the junction will have a large capacitance; therefore, Qrecharge will be relatively large. Using a number of smaller SPADs to get the same sensitive area is inefficient for planar junctions because of the large guard rings they require.

It has been proposed to have a deeper PN junction. This may be provided by the junction between a deep N well and the substrate. This would increase the QE for the longer wavelengths. The primary carrier transport mechanism would be diffusion which is relatively slow. There would be a relative high carrier transit jitter. This means the cycle for triggering of the avalanche effect and subsequent quenching would be longer as compared to the previous arrangement. This is due to a requirement for an increased epitaxy thickness.

The PN junction has to be capacitively coupled to the sensing node. This is undesirable because the capacitor required for the capacitive coupling is rather large, consuming pixel area and causing greater power consumption with each SPAD pulse.

A relatively large guard ring is required for lateral isolation.

Each of these options previously discussed require separate wells for different SPADs. Well sharing is not supported.

Figure 3:
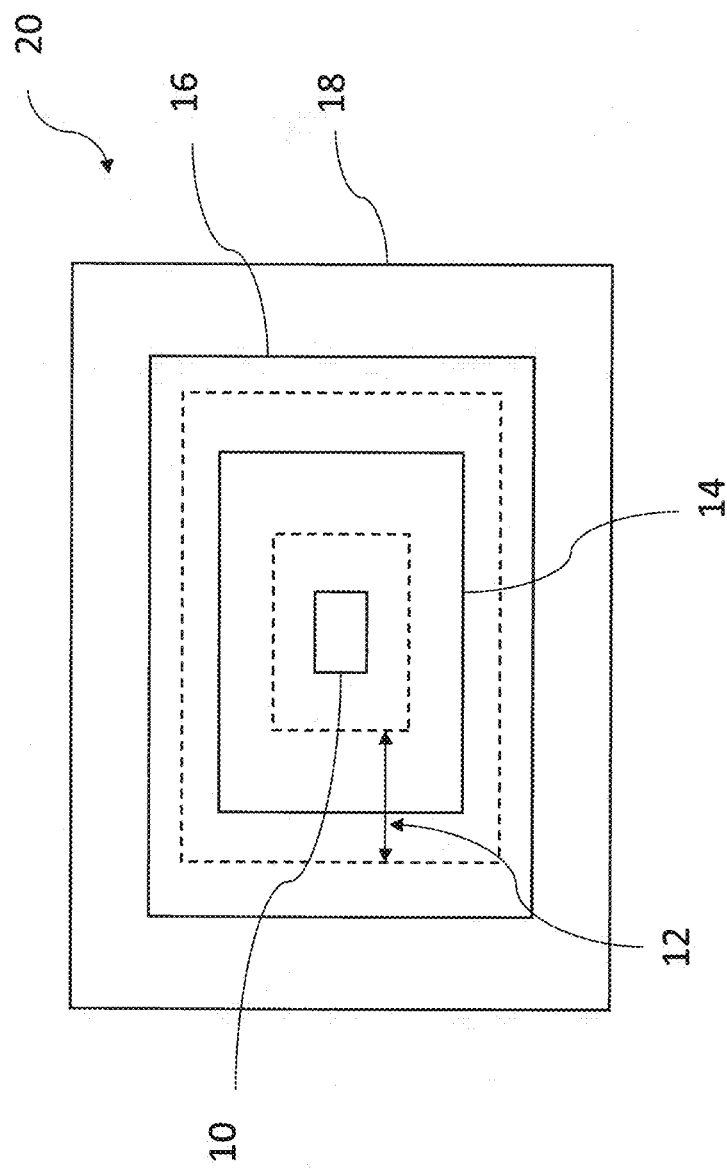
FIG. 3 is a schematic plan view of a SPAD according to an embodiment.

Reference is made to FIG. 3 which is schematically shows an avalanche diode of an embodiment. FIG. 3 is a plan view of the diode along a plane which is perpendicular to the direction from which light impinges on the diode. The center part of the diode has a DTI 10. This is surrounded by an N-doped region 14. The N-doped region is surrounded by a P region 16. The P region is surrounded by a DTI 18. A so-called vertical junction is provided, that is vertical with respect to the lateral plane on which light is received.

As shown in the arrangement of FIG. 3, there is a breakdown region referenced 12 which is provided by an area of N doping and P doping which are adjacent one another around the PN junction.

The device may have any suitable size. In some embodiments for example a SPAD can be provided which has an area of 2 μm×2 μm and a depth of 6 μm. These dimensions are by way of example only and in different embodiments may have different sizes. For example the X-Y dimensions may be in the range of 1 μm to 10 μm. The X and Y dimension can be the same or similar or be different. The depth may range from around 2.5 μm (currently this is the thickness of the silicon for a BSI process optimized for visible light) to around 10 μm.

There are two factors which need to be considered when selecting the depth of the junction. Firstly, the capacitance of the junction (and therefore power consumption) increases with the depth, and secondly, deep trenches are usually fabricated with RIE (reactive ion etching) which has a limited aspect ratio on the trench dimensions (~30:1). Making a trench deeper than ~10 μm would require the trench to be made wider at the top. Furthermore, the angle of the trench sidewalls would create a breakdown voltage which varies significantly with depth.

The depth may be dependent on the desired power versus QE trade off.

By way of example only, the break down voltage may be of the order of 19V. However, it should be appreciated that other embodiments may have different breakdown voltages.

As the vertical junction does not require a guard ring, in some embodiments a larger SPAD such as described in relation to FIG. 2 may be replaced with a plurality of smaller SPADs ones tiled together. This is described in more detail later. When a photon is detected, only one of the junctions will avalanche, which means less power is consumed. In some embodiments, the smaller SPADs in this mode have separate anode connections, to achieve a power saving.

Reference is made to FIGS. 4a to 4e which schematically illustrate a method of manufacturing the SPAD shown in FIG. 3.

Reference is first made to FIG. 4a. A suitable substrate 400 is provided. In some embodiments, the substrate may be silicon. In other embodiments, the substrate can be any other suitable semi-conductor.

A photoresist layer 402 is deposited on the silicon substrate. As shown in FIG. 4a, two areas 407 of the photoresist layer have been removed to expose the underlying silicon. It should be appreciated that each of the areas may comprise a rectangular ring with one within the other. It should be appreciated that the ring can have any other suitable shape. Other examples include a circular or ovoid shape.

The width of the exposed areas may be of the order of 150-300 nm. The two areas may be spaced apart by a distance of the order of 200 nm to 5 μm. However, it should be appreciate that the required distance will depend on one or more factors such as application of the SPAD and breakdown voltage required. If a higher breakdown voltage is required then the distance is increased and vice versa.

Referring now to FIG. 4b, a DTI etch is performed to provide a trench. This may be to a depth of around 3 to 10 μm.

Reference is made to FIG. 4c. The photoresist layer is removed. The trench is then filled. In other embodiments, the trench may be first filled and then the remaining photoresist layer is removed. One trench 406 is filled with an electrically insulating material with an N dopant and the other trench 408 is filled with an electrically insulating material with a P dopant. The N dopant may be any suitable material and may, for example, be a phosphorous, antimony or arsenic. The P dopant may be any suitable material, for example, boron. The electrically insulating material may be any suitable material, for example, silicon oxide.

The substrate is then annealed. The temperature used will be dependent on the materials but may be in the range of 850-1050° C. The anneal can be performed for a relatively long time. The length of time may be dependent upon the junction dimensions. Diffusion of the N and P type dopants may occur at a rate of ~0.3 μm per hour. Because there are two trenches of opposite dopant type, the number of hours may be defined by 0.3*d/2, where "d" is the distance between the two trenches in μm. For the simulation results used as an example, the annealing duration was around 2 hours. However it should be appreciated that the most appropriate anneal time may be determined based on the particular materials and dimensions.

The results of the anneal are shown schematically in FIG. 4d. The P dopants and the N dopants have diffused out of the respective trenches. Thus trench 406 comprises electrically insulating material such that the trench can provide an isolation function. The N type dopant forms a N type region around the insulating trench 406. Likewise, the trench 408 comprises electrically insulating material such that the trench can provide an isolation function. The P type dopant forms a P type region around the insulating trench 408. A PN junction 414 is formed between the P type region and the N type region. This is the SPAD PN junction.

Figure 4E:
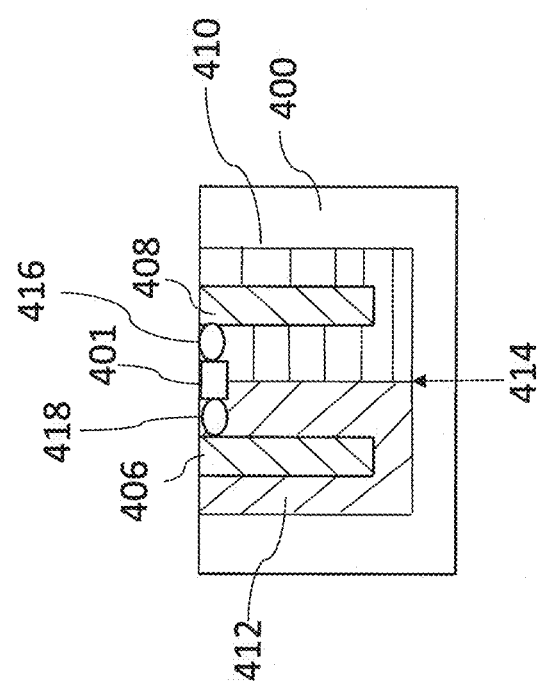
Figure 5:
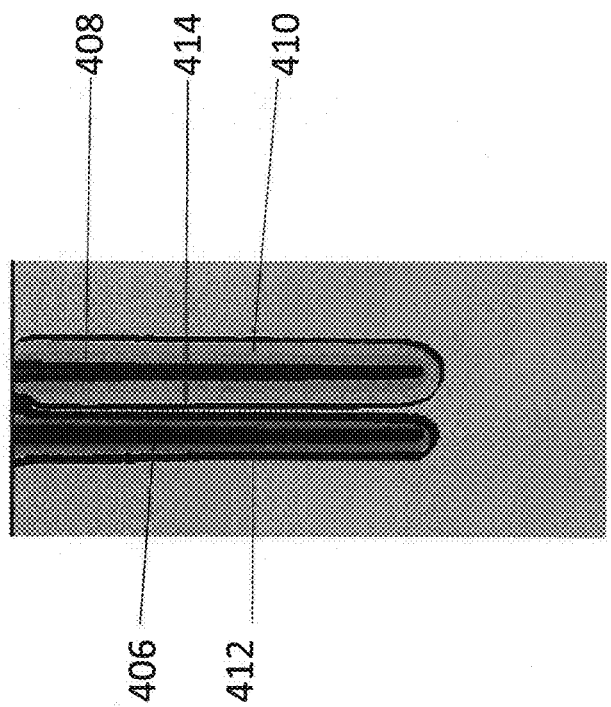
FIG. 5 shows a cross-section of a SPAD of an embodiment.

Reference is made to FIG. 4e. Electrode 418 above the N region and electrode 416 above the P region are provided.

The N and P regions are thus formed by trench diffusion. This means that ion implantation to form these regions may be avoided. Ion implantation may not be very effective mechanism for deeper depths as the implantation energy required may cause implantation damage.

The trench diffusion mechanism may provide a smooth and consistent avalanche region over the entire depth of the region.

It should be appreciated that in some embodiments fabrication of the PN junction is before any CMOS (complementary metal-oxide-semiconductor) flow begins. Therefore, the thermal budget of an MOS is unaffected. This means that annealing can be performed at a high relatively high temperature and for as long as is required without any adverse consequences.

The PN junction is formed adjacent to the DTI regions 406 and 408. This means that the need for a guard region may be avoided. The PN junction easily scales with epitaxial depth to give a good QE for a range of wavelengths, such as NIR.

As can be seen the PN junction is generally perpendicular to the surface of the silicon and forms a generally vertical break down junction.

The junction extends through a substantial part of the silicon depth in some embodiments. This means that the QE performance may be improved. The probability of detection of photons may be improved, for example with longer wavelengths. As the junction extends generally vertically, a good performance may be achieved over a wider range of wavelengths. This is because different wavelengths may have different penetration depths and because junction is vertical, photons from a range of different wavelengths can be reliably detected.

The use of a vertical breakdown junction means that the drift field exists through at least a large part if not all of the of the substrate depth. This means that there may be a relatively low transit jitter or delay.

In the arrangement shown, the avalanche region is isolated on either side by the DTI. This means that the need for guard rings or other isolation from adjacent SPADs is not required. Either the positive electrode or the negative electrode or both electrodes can be used as the moving node.

In another embodiment, instead of using an electrically insulating material during the trench fill process a conductive material is instead used. For example, the conductive material used may be polysilicon or tungsten. The electrical contacts are placed on the trench fill in this modification. N and P dopants are used as discussed in the previous examples.

With a conductive trench, the electrical contact can be placed directly on the trench. For an insulating trench fill, the contact is placed on the doping well next to the trench. This may create a region of high electric field near the surface. With a conductive trench, the contacts can be placed further apart. This may make the device easier to manufacture and higher performing if manufactured with conductive trench fill. However, it should be appreciated that in some embodiments, the use of an insulating trench fill may be advantageous in that there may be a reduction in optical cross talk. This is due to the refractive index of the insulating oxide compared to polysilicon.

With embodiments, it is possible to not have the guard ring of the prior art SPADs because of the vertical junction. With a very large SPAD of the prior art, the junction will have a large capacitance, therefore Qrecharge will large. Using a number of smaller SPADs to get the same sensitive area is inefficient for planar junctions because of the large guard rings they require with the prior art arrangement. In contrast, because the vertical junction arrangement of some embodiments does not require a guard ring, the larger SPAD can be replaced with multiple smaller SPADs tiled together. When a photon is detected, only one of the junctions will avalanche, which means less power is consumed. This is described in more detail later.

In some embodiments, a single trench may be formed as will now be described with reference to FIGS. 7a to 7d.

Figure 7C:
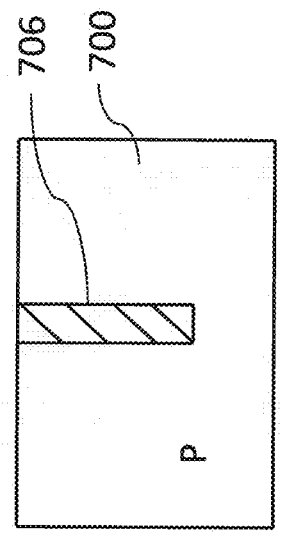
FIGS. 7a to 7d schematically show the steps in the manufacture of a SPAD according to another embodiment.
Figure 7D:
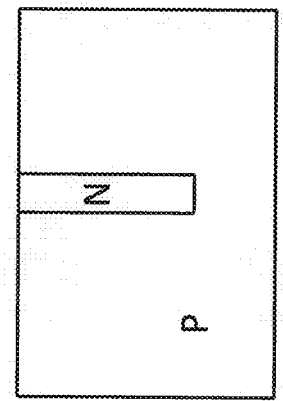
Figure 7A:
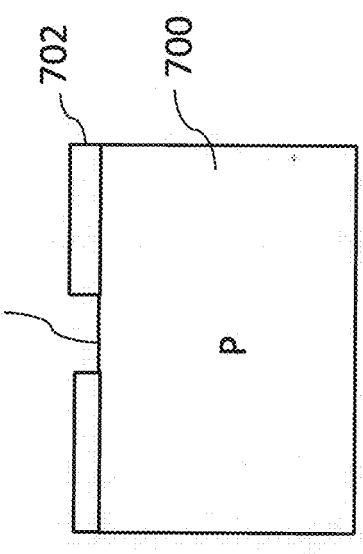

Reference is first made to FIG. 7a. A suitable substrate 700 is provided. In some embodiments, the substrate is doped with a p-type dopant. In other embodiments, the substrate is doped with an n-type dopant.

A photoresist layer 702 is deposited on the silicon substrate. As shown in FIG. 7a, one area 707 of the photoresist layer has been removed to expose the underlying silicon.

Figure 7B:
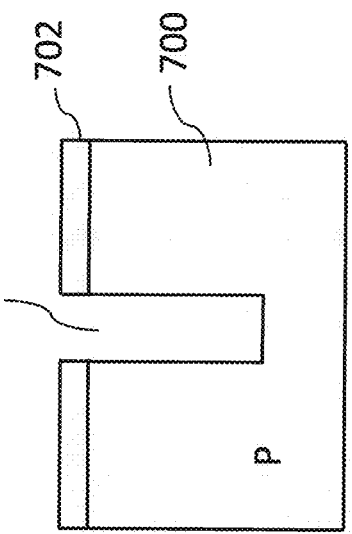

Referring now to FIG. 7b, a DTI etch is performed to provide a trench.

Reference is made to FIG. 7c. The photoresist layer is removed and the trench is filled. These can take place in any order. The trench 706 is filled with a material with an N dopant (or P dopant in the case that the substrate is N doped). The material may be conductive or insulating such as discussed above.

The substrate is then annealed. The results of the anneal are shown schematically in FIG. 7d. The P dopants in the substrate and the N dopants diffused out of the trench provide the PN junction. Annealing is needed to cause the dopant to diffuse out of the trench and into the substrate. This creates a smoother junction and allows the breakdown voltage to be controlled. The dopant diffuses outwards from the trench in all directions, so the PN junction is effectively 'wrapped around' the trench, as shown by the 'rounded squares' in FIG. 6b.

Figure 8C:
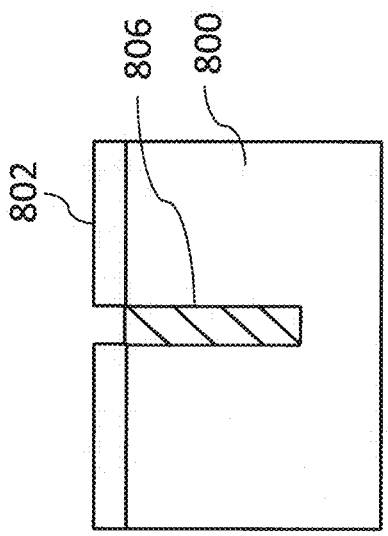
FIGS. 8a to 8e schematically show the steps in the manufacture of a SPAD according to another embodiment.
Figure 8D:
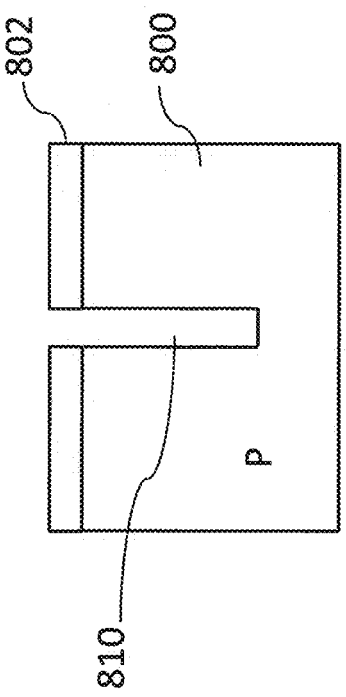
Figure 8A:
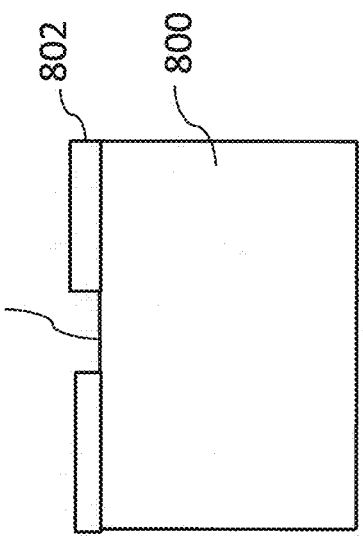

Reference is now made to FIGS. 8a to 8d which show another embodiment using the single trench technique Reference is first made to FIG. 8a. A suitable (undoped) substrate 800 is provided A photoresist layer 802 is deposited on the silicon substrate. As shown in FIG. 8a, one area 807 of the photoresist layer has been removed to expose the underlying silicon.

Figure 8B:
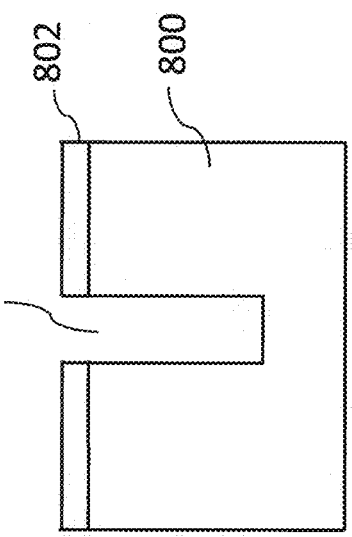

Referring now to FIG. 8b, a DTI etch is performed to provide a trench.

Reference is made to FIG. 8c. The photoresist layer is not removed but the trench is filled. The trench 806 is filled with a material with an P dopant (or N dopant in the alternative). The material may be conductive or insulating such as discussed above.

The substrate is then annealed to diffuse the P (or N) dopant into the substrate. Another DTI etch is performed to remove the material from the trench 810, as shown schematically in FIG. 8d.

Figure 8E:
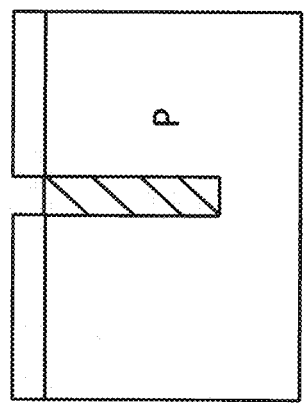

As shown in FIG. 8e, the photoresist layer is removed and the trench is filled. These can take place in any order. The trench 810 is filled with a material with an N dopant (or P dopant in the alternative). The material may be conductive or insulating such as discussed above. The substrate is then annealed to create the PN junction.

Figure 6A:
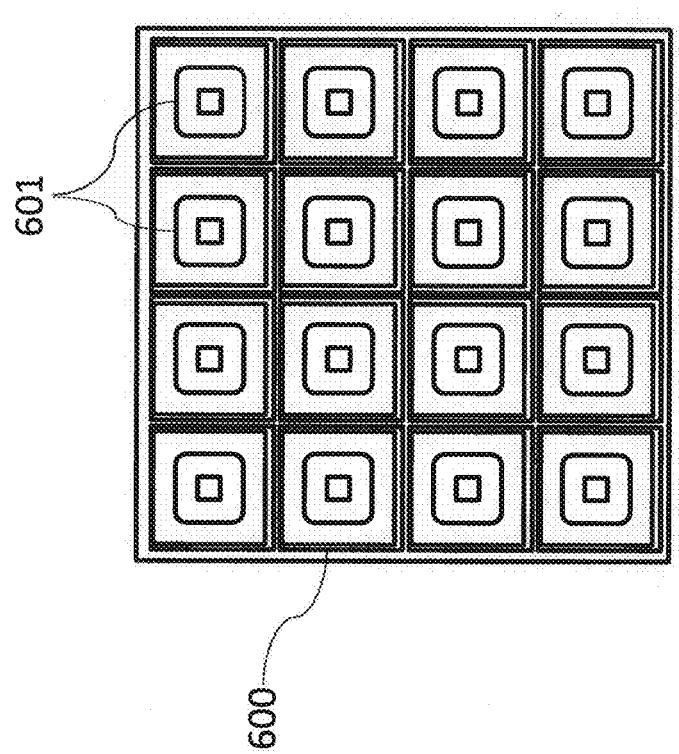
FIG. 6a shows an array of SPADs with guard rings.

In some embodiments, an array of SPADs 600 is provided. An example of such an array is shown in FIG. 6a. In the example shown in FIG. 6a, the array is a 4×4 array of SPADs 601. However, this is by way of example only and in other embodiments, the array may be bigger or smaller than that shown in FIG. 6a.

In contrast with the arrangements such as shown in FIG. 2, the pixel pitch of some embodiments may not be dominated by N well spacing. Accordingly, the circuitry associated with the SPAD can be provided much closer to the SPAD leading to more compact pixels. In some embodiments, it is possible to have multiple SPADs connected to a single sense node. This may reduce the power consumption per photon.

Some applications may require a relatively large amount of signal, and therefore a large SPAD. Because the vertical junction breakdown voltage is dependent upon the X-Y dimensions, in some embodiments, a plurality of vertical junction SPADs can be tiled together to form the equivalent of a larger SPAD (with the better QE that the vertical junction provides).

Figure 9:
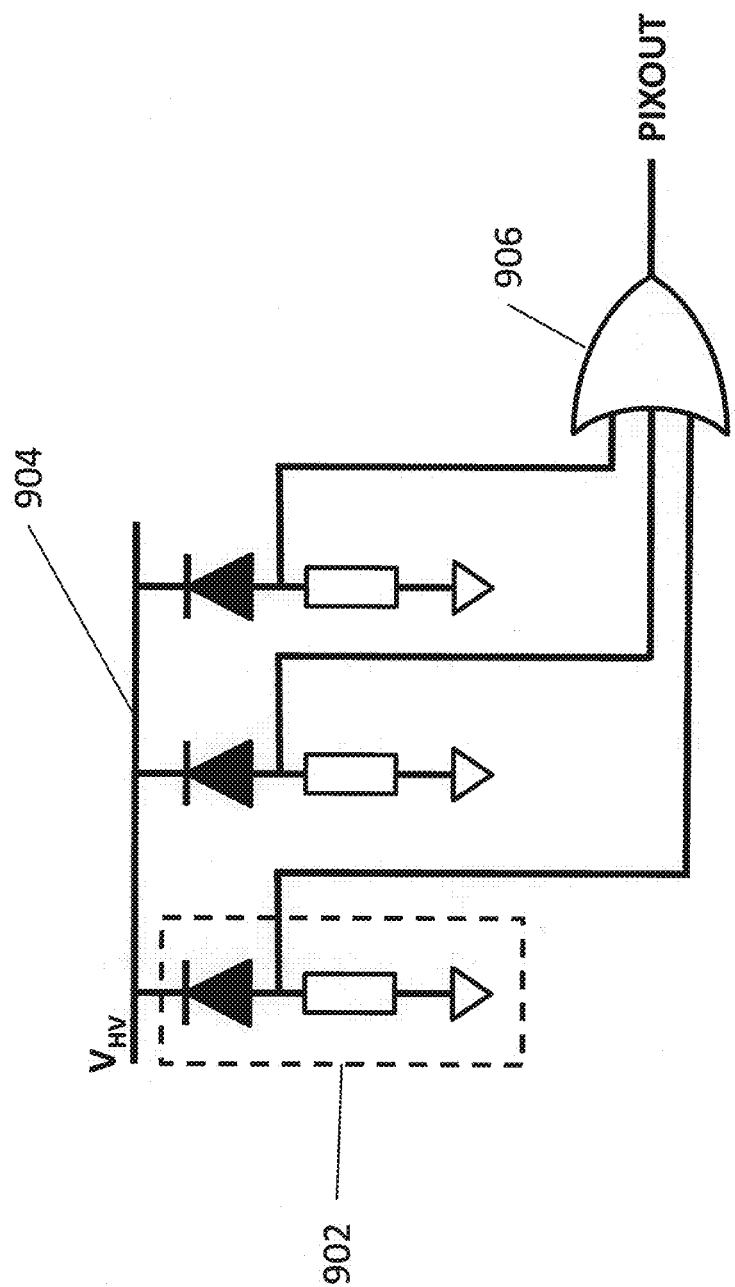
FIG. 9 schematically shows an embodiment in which multiple SPADs are connected to the same anode.

In the above situation, one way of connecting the SPADs which are together forming the equivalent of a SPAD would be to connect all their anodes together. This would result in identical operation to a 'normal' SPAD, but may not provide any power saving. Alternatively the SPAD are connected in an 'OR' scheme, as shown in FIG. 9, which schematically represents each individual SPAD 902 connected to the same anode 904, with each SPAD gate output collected at an 'OR' gate 906. Doing so would mean that only the voltage on the avalanching SPAD is changing, hence only the avalanching SPAD is consuming power. This may have the advantage of leaving the other SPADs available to detect further photons during the recharge time of this SPAD.

It should be appreciated that with an array of SPADs, it is possible to selectively control which SPADs are enabled. Accordingly, in the arrangement shown in FIG. 6a, all of the SPADs may be enabled. Alternatively, a single SPAD may be enabled. Alternatively, a subset of two or more SPADs may be enabled. In some embodiments, electronic apertures may be implemented.

Figure 10B:
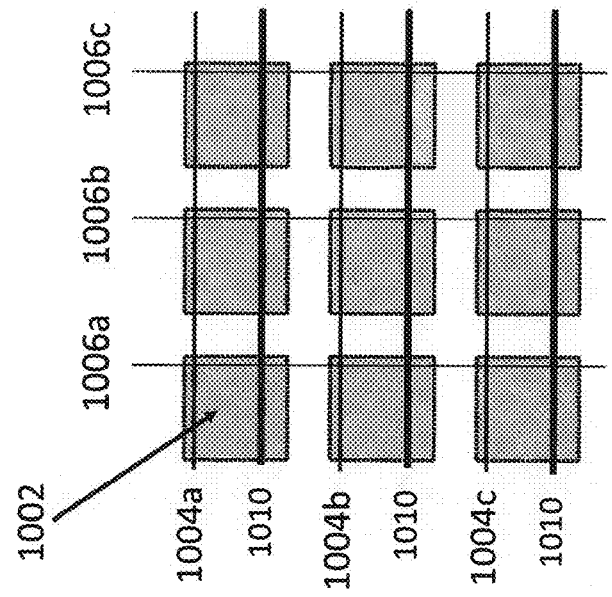
FIGS. 10a to 10c schematically show the selection of individual SPADs or groups of SPADs in an array according to some embodiments.
Figure 10A:
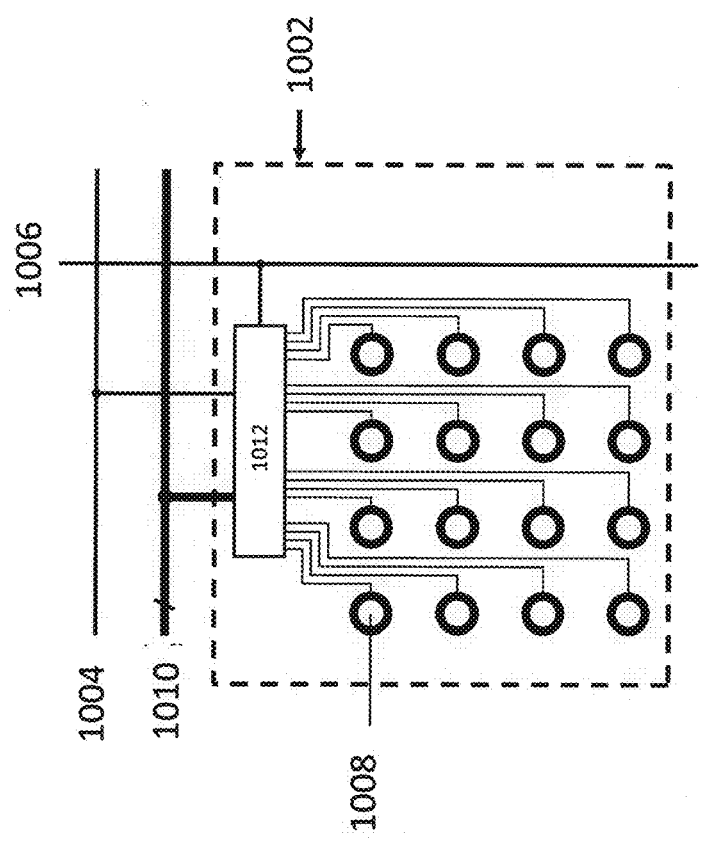

Single SPAD enabling: this requires a control signal per SPAD, and is shown schematically in FIG. 10a. Each SPAD pixel 1002 contains multiple individual SPADs 1008. Each SPAD is assigned a SPAD enable bolo to allow for individual SPAD control within a pixel by use of SRAM 1012. In some embodiments, multiple SPAD pixels may be used in an array. This allows the control as to which of the SPADs are enabled and thus able to detect a photon.

FIG. 10b shows the case of multiple SPAD pixels 1002. Each pixel is assigned a row enable 1004a-c and a column enable 1006a-c; it should be understood that any number of rows or columns may be used. In combination, the selection of an appropriate row enable 1004, column enable 1006, and SPAD enable bolo permits individual SPAD 1008 selection from an array of SPAD pixels, each containing multiple SPADs.

Figure 10C:
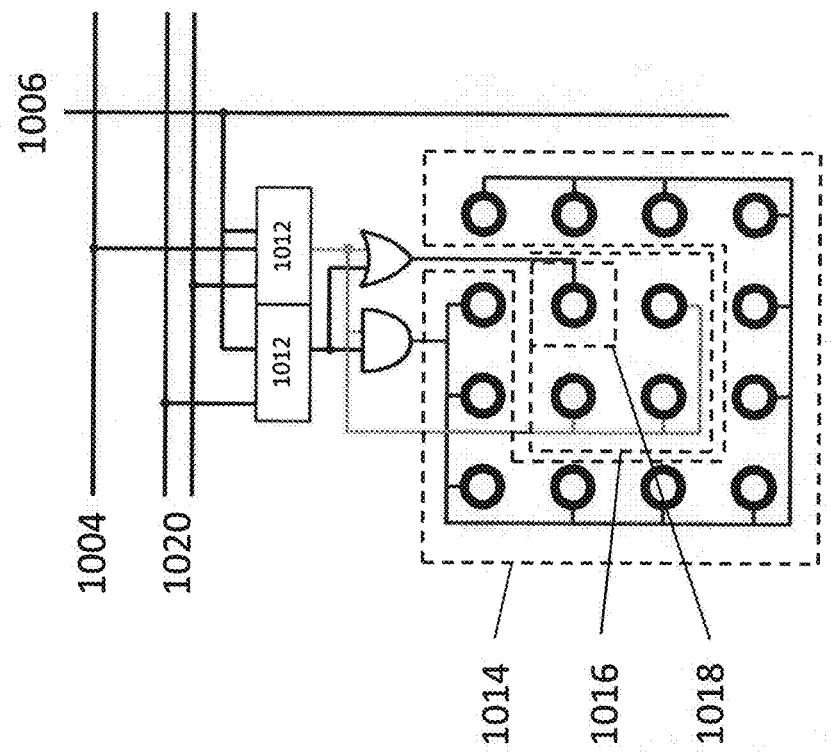

Group SPAD enabling: FIG. 10c depicts an array of SPADs within a pixel as in FIG. 10a, but, the SPAD array being split into several groups, e.g. one group for the 12 outer ring of SPADs 1014 of FIG. 10c, one group for the inner 4 SPADs 1016, and one 'group' which just contains one of the 4 inner SPADs 1018. Each group may be assigned a group enable 1020. In the example arrangement of FIG. 10c, the use of two control signals of group enable 1020 and two SRAM cells 1012, allows for the selection of either one of the inner four SPADs 1018, the inner four SPADs 1016, or all 16 SPADs within the SPAD pixel. It should be understood that this example is illustrative only; in other embodiments different group arrangements may be used.

FIG. 6a shows an arrangement where the SPADs have two trench structure and FIG. 6b shows an arrangement where the SPADs have a one trench structure.

As compared to some known arrangements, embodiments may be provided, where more SPADs can be provided in a given area. In arrangements, for example, such as shown in FIG. 2, the need for the guard ring is a limiting factor to increasing the density of SPADs in a given area. In contrast, some embodiments provide compact structures as the DTI provide shielding between SPADs. In some embodiments, each SPAD will have two DTIs. In other embodiments, the outer DTI will be shared along a given edge by the SPADs on either side of that edge. In the embodiments where a DTI is shared, the p region on one side of the DTI will be part of one SPAD and the p region on the other side of the DTI will be the p region of another SPAD.

The example embodiments have shown the P and N regions in one particular orientation. In other embodiments, the P and N regions may be swapped.

Some embodiments may be used with BSI (backside illumination) type structures. This means that the photons impinges on the SPAD via the surface which is opposite the electrodes.

In some embodiments, a metal layer may be provided on the resulting semiconductor, opposite to the surface via which the photons impinge. Accordingly, the photon may be reflected from this metal. This means that a penetration depth for wavelengths which is larger than the actual depth of the epitaxial layer can be supported. A penetration depth of up to twice the depth of the epitaxial layer may be supported.

It should be appreciated that other embodiments may be used with front side illumination. It should be appreciated that in those embodiments, the area above the breakdown region may need to be exposed so as to be able to receive impinging photons.

SPADs may be used in a wide range of applications. For example, SPADs may be used for ToF (time of flight) applications. By way of example only, some SPADs may be used for gesture detection, automotive applications and depth mapping. Automotive applications may comprise detection of user instructions and detection of objects around a vehicle.

Some embodiments may provide one or more of the following advantages: improved scalability; an improved QE for near IR wavelengths.

Various embodiments with different variations have been described here above. It should be noted that those skilled in the art may combine various elements of these various embodiments and variations.

Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

What is claimed is:

1. An avalanche diode comprising:
   a first doped region of a first doping type;
   a second doped region of a second doping type opposite to the first doping type, wherein the second doped region is adjacent to and directly contacting the first doped region to form a PN junction;
   a first deep trench structure directly adjacent to the first doped region;
   a second deep trench structure directly adjacent to the second doped region; and
   an area via which photons impinge, the PN junction extending substantially vertically with respect to the area.

2. The avalanche diode as claimed in claim 1, wherein the first deep trench structure is filled with an electrically insulating material with an N dopant and the second deep trench structure is filled with an electrically insulating material with a P dopant.

3. The avalanche diode as claimed in claim 2, wherein the electrically insulating material comprises an oxide of silicon.

4. The avalanche diode as claimed in claim 1, wherein the first deep trench structure is filled with a conductive material.

5. The avalanche diode as claimed in claim 4, wherein the conductive material comprises polysilicon or tungsten.

6. The avalanche diode as claimed in claim 1, wherein the first deep trench structure is filled with an insulating material.

7. The avalanche diode as claimed in claim 6, wherein the insulating material comprises silicon oxide.

8. An array of avalanche diodes, wherein each avalanche diode in the array of avalanche diodes comprises:
   a first doped region of a first doping type;
   a second doped region of a second doping type opposite to the first doping type, wherein the second doped region is adjacent to and directly contacting the first doped region to form a PN junction;
   a first deep trench structure directly adjacent to the first doped region;
   a second deep trench structure directly adjacent to the second doped region so that the PN junction is disposed between the first deep trench structure and the second deep trench structure; and
   an area via which photons impinge, wherein the PN junction extends substantially vertically with respect to the area.

9. The array as claimed in claim 8, wherein the first deep trench structure is doped with an n-type dopant and the second deep trench structure is doped with an p-type dopant.

10. The array as claimed in claim 8, further comprising:
    a common anode to which each avalanche diode of the array of avalanche diodes are coupled;
    a plurality of cathodes coupled to respective avalanche diodes of the array of avalanche diodes; and
    an OR gate comprising a plurality of inputs to which a respective cathode of each avalanche diode of the array of avalanche diodes is coupled.

11. The array as claimed in claim 8, wherein the first deep trench structure of an avalanche diode of the array is shared with one or more other avalanche diodes of the array.

12. An avalanche diode comprising:
a first deep trench structure;
a first doped region of a first doping type surrounding the first deep trench structure in a plan view;
a second doped region of a second doping type opposite to the first doping type, wherein the second doped region surrounds and directly contacts the first doped region in the plan view; and
a second deep trench structure surrounding and directly contacting the second doped region in the plan view.

13. The avalanche diode as claimed in claim 12, wherein:
the first deep trench structure is filled with an electrically insulating material comprising a first dopant of an n-type;
the first doping type is the n-type;
the second deep trench structure is filled with an electrically insulating material comprising a second dopant of a p-type; and
the second doping type is the p-type.

14. The avalanche diode as claimed in claim 13, wherein the electrically insulating material comprises an oxide of silicon.

15. The avalanche diode as claimed in claim 12, wherein:
the first deep trench structure is filled with an electrically insulating material comprising a first dopant of a p-type;
the first doping type is the p-type;
the second deep trench structure is filled with an electrically insulating material comprising a second dopant of an n-type; and
the second doping type is the n-type.

16. The avalanche diode as claimed in claim 15, wherein the electrically insulating material comprises an oxide of silicon.

17. The avalanche diode as claimed in claim 12, wherein the first deep trench structure is filled with a conductive material.

18. The avalanche diode as claimed in claim 17, wherein the conductive material comprises polysilicon or tungsten.

19. The avalanche diode as claimed in claim 12, wherein:
a width of the first deep trench structure is between about 150 nm and about 300 nm;
a depth of the first deep trench structure is between about 3 μm and about 10 μm; and
a separation distance between the first deep trench structure and the second deep trench structure is between about 200 nm and about 5 μm.

\* \* \* \* \*